United States Patent
Kulkarni et al.

(10) Patent No.: US 6,323,709 B1
(45) Date of Patent: Nov. 27, 2001

(54) HIGH-SPEED, COMPACT, EDGE-TRIGGERED, FLIP-FLOP CIRCUIT

(75) Inventors: Shriram Kulkarni; Mayukh Bhattacharya; Pinaki Mazumder, all of Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 09/573,800

(22) Filed: May 18, 2000

Related U.S. Application Data

(60) Provisional application No. 60/134,682, filed on May 18, 1999.

(51) Int. Cl.$^7$ ..................................................... H03K 23/80
(52) U.S. Cl. ........................... 327/195; 327/196; 327/218; 326/134; 326/135; 377/128
(58) Field of Search ..................................... 327/195–197, 327/200–203, 208–212, 217, 218, 220, 326, 397, 402, 500, 568; 326/134, 135; 377/128

(56) References Cited

U.S. PATENT DOCUMENTS

| | | | |
|---|---|---|---|
| 4,057,741 | 11/1977 | Piguet | 327/211 |
| 4,140,924 | 2/1979 | Oguey et al. | 377/121 |
| 4,656,368 | 4/1987 | McCombs et al. | 327/203 |
| 5,189,315 | 2/1993 | Akata | 327/203 |
| 5,434,811 | * 7/1995 | Evans, Jr. et al. | 365/145 |
| 5,444,751 | * 8/1995 | Sage | 377/78 |
| 5,930,323 | * 7/1999 | Tang et al. | 377/77 |

OTHER PUBLICATIONS

Jiren Yuan, et al., High–Speed CMOS Circuit Technique, The Journal of Solid State Circuits, vol. 24, No. 1, Feb. 1989, pp. 62–70.

\* cited by examiner

Primary Examiner—Tuan T. Lam
(74) Attorney, Agent, or Firm—Brooks & Kushman P.C.

(57) ABSTRACT

A high-speed, compact, edge-triggered flip-flop circuit is provided which includes an input circuit section, a latch circuit section and an output circuit section. The input circuit section includes at least one transistor such as a field-effect transistor (FET) which determines the logic function of the flip-flop such as D, S-R, or T, and provides a first stage of latching. The input circuit section receives the logic control signals such as D, S-R, or T, and a clock signal. In one embodiment of the invention, the latch circuit section includes two series-connected negative differential resistance (NDR) diodes. In this embodiment, a common terminal of the two NDR diodes is connected to the data output of the input circuit section and to the data input of the output circuit section. In the first embodiment, the output circuit section includes a plurality of FETs which perform second stage of latching such that the output of this section reflects the logic of the chosen inputs only at the occurrence of either a low-to-high transition or a high-to-low transition on the clock signal, but not both, depending on the chosen configuration of the flip-flop circuit. In a second embodiment, a D flip-flop circuit includes a latch circuit section which includes at least one NDR diode connected to the data output of the input circuit section and an output circuit section which also includes at least one NDR diode connected to the output of the output circuit section. In the second embodiment, the flip-flop circuit may use: 1) bistable NDR logic; 2) cascaded NDR latches; or 3) pseudo-bistable NDR logic with a true, single-phase clock.

33 Claims, 4 Drawing Sheets

HIGH-SPEED, COMPACT, EDGE-TRIGGERED, FLIP-FLOP CIRCUIT

CROSS-REFERENCE TO RELATED APPLICATIONS

This application claims the benefit of U.S. provisional patent application Serial No. 60/134,682 filed May 18, 1999, entitled "Edge-triggered Flip-flop Circuit Topologies Using NDR Diodes And FETs"

GOVERNMENT RIGHTS

This invention is made with government support under Contract No. SRA-3312670A/TI awarded by DARPA.

TECHNICAL FIELD

This invention relates to edge-triggered flip-flop circuits.

BACKGROUND ART

Flip-flop circuits are essential components in any digital system design and are used in almost all integrated circuits that are manufactured. Flip-flop circuits are normally used to store data that is a result of a computation performed by a digital circuit or they are used to sequence data in an integrated circuit in order to facilitate some manner of computation.

Binary flip-flops are flip-flop circuits that store two possible signal levels, logic low and logic high. All signals that are applied to the flip-flop circuits can be considered to have the aforementioned two possible logic levels.

There are two distinct approaches to such conventional flip-flop design. The first approach uses gate-level design i.e. individual functional logic gates such as NAND, NOR, AND, OR or INVERSION are used to achieve edge-triggering effect. These solutions are static gates and have high device count as well as low speed of operation. They are, however, very reliable and robust.

The second approach uses a dynamic or pseudo-static flip-flop implementation. These are more compact and faster implementations of a flip-flop as compared to the static approach. However, the dynamic nature of these circuits makes them less reliable. The latter approach to flip-flop design, however, is most prevalent in state-of-the-art ICs that constantly aim to push circuit operation at greater speeds.

One important characteristic of edge-triggered flip-flop circuits is that data presented at the input of the circuit or as determined by the flip-flop control signals such as S-R or T is reflected at the output of the circuit either on the low-to-high transition (positive edge-trigger) or the high-to-low (negative edge-trigger) transition of a clocking signal.

In general, the ideal behavior of a flip-flop circuit would be to act as a storage element but not introduce additional delay in the signal path in which the flip flop is inserted, and to not consume any circuit area in doing so. It is well known that the real life behavior of flip-flop circuits is non-ideal as a result of which flip-flop circuits do cause delay and area overhead in integrated circuits. Thus, one of the objectives of a flip-flop design is to reduce its delay and area. Also, the non-ideal behavior of flip-flop circuits dictates that the input signals to the flip-flop be held a constant value for a small window around the edge of the clocking signal. It is also a criterion of flip-flop circuit design to reduce this window to a very small fraction of the total period of the clocking signal.

NDR diodes such as resonant tunneling diodes (RTDs) have been used to design high-speed and compact digital logic circuits due to their picosecond switching speeds and folded current vs. voltage characteristics. While latching storage circuits can be built efficiently due to the inherent bistability in the NDR diode characteristics, such circuits use level-sensitive clocking signals, i.e. any change in the input when the clocking signal is active (be it high or low) is reflected at the output. Thus, in order for the circuit to function correctly, input data must be maintained for the entire duration of the active portion of the clocking signal and not just in a small window around the active transition edge of the clocking signal.

The time period for which the data needs to be constant before the active clock edge is called the setup time and the time period for which the data needs to be held constant after the active clock edge is called the hold time. There are no known implementations of edge-triggered flip-flop circuits using NDR diodes.

Prior art U.S. patents, generally relevant the present invention include: U.S. Pat. Nos. 4,057,741; 4,140,924; 4,656,368; and 5,189,315.

A prior art article also generally relevant to the present invention is: J. Yuan and C. Svensson, "High-Speed CMOS Circuit Technique", IEEE JOURNAL OF SOLID-STATE CIRCUITS, Vol. 24, No. 1, February 1989, pp. 62–70.

DISCLOSURE OF INVENTION

An object of the present invention is it provides a high-speed, compact, edge-triggered, flip-flop circuit.

Another object of the present invention is it provides a high-speed, compact, edge-triggered, flip-flop circuit which also has improved reliability.

Yet another object of the present invention is it provides a high-speed, compact, edge-triggered, flip-flop circuit which more closely approximates the ideal behavior of a flip-flop circuit by reducing delay and area overhead on integrated circuits.

In carrying out the above objects and other objects of the present invention, a high-speed, compact, edge-triggered, flip-flop circuit includes an input circuit section having at least one input for receiving at least one input signal, a clock input for receiving a clock signal having two states and a data output. A latch circuit section has at least one semiconductor device which has negative differential resistance characteristics and is are connected to the data output of the input circuit section. An output circuit section has a data input connected to the at least one semiconductor device, a clock input for receiving the clock signal and a data output wherein a value is stored at the data output of the output circuit section in response to the at least one input signal when the clock signal makes a transition from one of its states to the other one of its states.

The circuit may be a D flip-flop circuit wherein the at least one input signal is a data input signal having a value and the value stored at the data output of the output circuit section has the value of the data input signal after the clock signal makes the transition.

The circuit may be a T flip-flop circuit wherein the at least one input signal may also be a toggle input signal to toggle the circuit when the clock signal makes the transition.

The circuit may be an S-R flip-flop circuit wherein the input circuit section has first and second inputs for receiving set or reset input signals, respectively, to set or reset the circuit when the clock signal makes the transition.

The circuit may further include an asynchronous preset circuit section for setting the data output of the output circuit section to a stable state without the necessity of receiving the clock signal, and an asynchronous reset circuit section for setting the data output of the output circuit section to a stable state without the necessity of receiving the clock signal.

The latch circuit section may include a plurality of semiconductor devices such as a pair of negative differential resistance diodes. The diodes may be series-connected resonant tunneling diodes.

The plurality of semiconductor devices may include a pair of negative differential resistance diodes having a folded-back, current-voltage characteristic.

The output circuit section may also have at least one semiconductor device having negative differential resistance characteristics and may be connected to the data output of the output circuit section.

The output circuit section may also include a plurality of semiconductor devices having negative differential resistance characteristics and may be connected to the data output of the output circuit section.

The circuit may include a pair of cascaded bistable NDR inverters which operate on opposite phases of the clock signal.

The circuit may also include a pair of cascaded bistable NDR latches which operate on opposite phases of the clock signal.

The circuit may further include a pair of cascaded pseudo-bistable latches which operate on the same phase of the clock signal.

The input circuit section may include a feedback circuit section connected to the data output of the output circuit section and the at least one input of the input circuit section.

The edge-triggered flip-flop circuit of one embodiment of the present invention, also referred to as a quantum metal oxide semiconductor (QMOS) flip-flop, comprises a circuit built using negative differential resistance (NDR) diodes and metal oxide semiconductor field effect transistors (MOSFETs). Specifically, circuits of this embodiment of the present invention receive and store data. The input circuit section includes a clock transistor along with a data input or other transistors that receive controlling inputs. On the active transition of the clocking signal, the output of the input circuit section is latched by the latch circuit section which is formed by two series-connected NDR diodes. Any change in the values of the data input or the controlling input after the active clock edge will not cause a change in the latched valued held by the latch circuit section since the clock transistor in the input circuit section is turned off.

This latched value forms the input to the output circuit section. On the active edge of the clocking signal, the output circuit section effectively acts as two series-connected inverting circuits and hence the value stored in the latch circuit section is transferred to the output of the flip-flop circuit.

Prior to the active edge of the clocking signal, the output of the flip-flop circuit is isolated from the input circuit section and hence, the flip-flop output reflects changes determined by the inputs only on the active edge of the clocking signal.

The NDR diodes can be integrated on top of source/drain regions of the field-effect transistors. Thus, in an integrated circuit environment, they effectively will not use additional chip area than what is already consumed by the FETs. This advantage of NDR diodes reduces the area of flip-flop circuits.

Also, the NDR diodes have high switching speeds and hence the time required by the latch circuit section to latch data presented to it is small. This reduces the delay of the flip-flop circuit. Also, depending on whether a D, S-R or T flip-flop is implemented, at most one or two transistors are in the series path to the latch circuit section. This means the setup and hold times of this flip-flop circuit are very small. Thus, the three major criterion mentioned earlier regarding desirable flip-flop characteristics are well satisfied by the circuit of the present invention.

An edge-triggered D flip-flop circuit constructed in accordance with the present invention can be implemented using only six semiconductor devices. It offers a very significant improvement in power-delay as compared to a state of the art true single phase clock (TSPC) D flip-flop implemented in CMOS.

A new static latch circuit improves circuit reliability as compared to the dynamic design of the TSPC flip-flop. The flip-flop circuit of the present invention may be a D, S-R or T flip-flop that can be positive or negative edge-triggered.

Preset and reset operations can be added at the expense of just two additional semiconductor devices.

The T flip-flop circuit of the present invention uses a novel feedback technique that reduces the size of the implementation and thus affords even further area savings as compared to conventional implementations.

The above objects and other objects, features, and advantages of the present invention are readily apparent from the following detailed description of the best mode for carrying out the invention when taken in connection with the accompanying drawings.

BEST MODE FOR CARRYING OUT THE INVENTION

Preferred embodiments of the edge-triggered flip-flop circuits of the present invention are described herein below with reference to the drawings.

Figure 1:
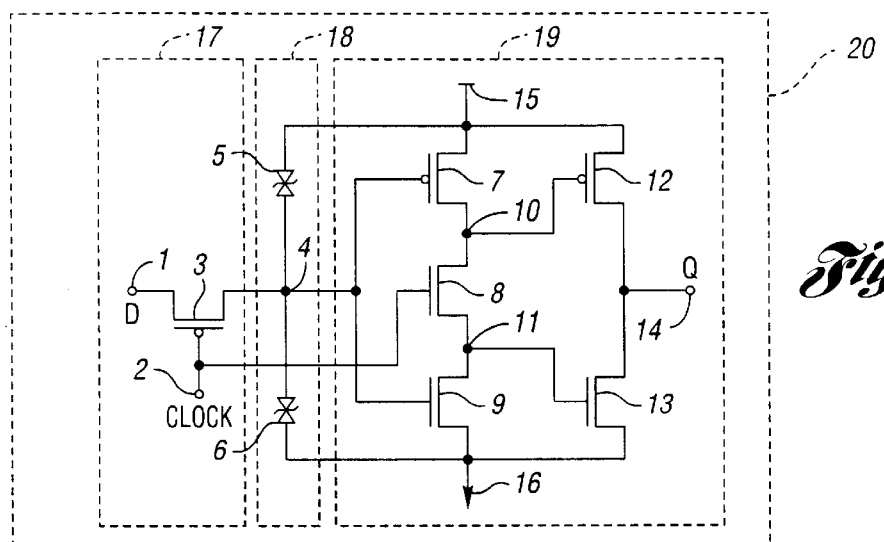
FIG. 1 is a schematic diagram of a QMOS positive edge-triggered D flip-flop circuit of the present invention.

Referring now to FIG. 1, a positive edge-triggered D flip-flop circuit is indicated generally at 20. D flip-flop 20 includes an input circuit section at block 17, a latch circuit section 18, and an output circuit section or block 19. The input block of the D flip-flop 20 includes a p-type FET 3 whose source terminal is connected to the D input 1 and drain terminal is connected to the output terminal 4 of the input block. The p-type FET 3 is the clock transistor of the input block 17 and its gate terminal is connected to the clock input 2 of the flip-flop circuit 20.

The latch circuit section 18 includes two series-connected NDR diodes 5 and 6. A common terminal between the two NDR diodes 5 and 6 is connected to the output 4 of the input block 17, and it also forms the input to the output block 19. The other terminal of NDR diode 5 is connected to the power supply 15, while the other terminal of NDR diode 6 is connected to the ground terminal 16.

The output block 19 consists of a plurality of FETs 7, 8, 9, 12 and 13 that form the second latching stage of the flip-flop circuit. The n-type FET 8 is the clock transistor of the output block and its gate terminal is connected to the clock input 2 of the flip-flop circuit 20. The source of the n-type clock transistor 8 is connected to the drain terminal 11 of an n-type transistor 9 which has a path to the ground terminal 16 via a connection to its source terminal. The drain of the n-type clock transistor 8 is connected to the drain terminal 10 of a p-type transistor 7 which has a path to the supply terminal 15 via a connection to its source terminal. The gate terminals of FETs 7 and 9 are connected together to the output of the input block 4.

FETs 12 and 13 form the output stage 19 of the D flip-flop circuit 20. The common terminal between them 14 forms the output, Q, of the flip-flop circuit 20. The source terminal of p-type FET 12 is connected to the power supply 15, while the source terminal of the n-type FET 13 is connected to the ground terminal 16. The gate of the p-type FET 12 is connected to the drain terminal 10 of p-type FET 7, and the gate of the n-type FET 13 is connected to the drain terminal 11 of n-type FET 9.

When the clock input 2 is held low, the value of the data input, D1, is passed to the node 4 because the p-type clock transistor 3 is turned on. Irrespective of the value of node 4, the value of the flip-flop output 14 does not change from its previous value when the clock input 2 is low.

This is analyzed as follows. If the signal at node 4 is low, only the p-type transistor 7 in the output block 19 is turned on, resulting in node 10 turning high. Node 11 retains its previous value since both n-type transistors 8 and 9 are off. A high value on node 10 implies p-type transistor 12 is off and hence does not conduct. N-type transistor 13 is unaffected since its gate input 11 is unchanged. Thus, the output node 14 of the flip-flop circuit remains unchanged.

Now, under the above conditions of the clock input, if the signal at node 4 is high, only the n-type transistor 9 in the output block 19 is turned on, resulting in node 11 turning low. Node 10 retains its previous value since both p-type type transistor 7 and n-type transistor 8 are off. A low value on node 11 implies n-type transistor 13 is off and hence does not conduct. P-type transistor 12 is unaffected since its gate input 10 is unchanged. Thus, yet again, the output node 14 of the flip-flop circuit 20 remains unchanged. Now, when the clock input 2 transitions from low to high, the p-type clock transistor 3 turns off. The value of node 4 is held to the value of the D input 1 at the clock edge by the latch circuit 15 comprised of NDR diodes 5 and 6, and this value now remains constant irrespective of any changes in the D input 1.

When the clock signal goes from low to high, the n-type clock transistor 8 turns on, and the combination of FETs 7, 8 and 9 acts as an inverter circuit producing signal values at nodes 10 and 11 that represent the logical inversion of node 4. Under these conditions, the voltage values at nodes 10 and 11 are separated only by the threshold voltage drop across the n-type clock transistor 8 and can be considered logically equivalent since the threshold voltage is a small fraction of the power supply voltage that determines the voltage separation between logical low and logical high. The FETs 12 and 13 act as another inverter circuit and hence the value obtained at node 14 is the same as that at node 4 since two successive inversions of a logic signal has the effect of restoring the original signal value. Also, having earlier said that the value at node 4 is the value of the D input 1 at the low-to-high transition of the clock, we conclude that the value of output, Q 14, of the flip-flop circuit 20 after the high going clock edge is the same as the input, D 1, of the flip-flop circuit at the high going clock edge, thus achieving the desired positive edge-triggered D flip-flop function.

Another common type of flip-flop circuit, called an S-R flip-flop, is also known as the set-reset flip-flop. In general, the function of an S-R flip-flop can be explained as follows. When a controlling signal input, called S, is high and another controlling signal input, called R, is low, on the active edge of the clock input, the output of the flip-flop circuit should become high. This is the set operation. When the signal input S is low and the signal input R is high, on the active edge of the clock input, the output of the flip-flop circuit should become low. This is called the reset operation. When both signals S and R are low, on the active edge of the clock input, the output of the flip-flop circuit should remain unchanged from its previous value.

Figure 2:
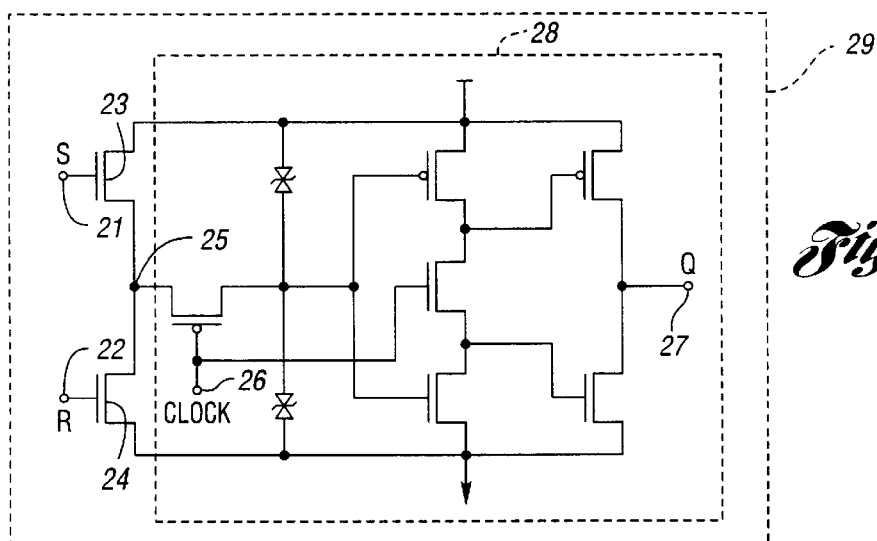
FIG. 2 is a schematic diagram of a QMOS positive edge-triggered S-R flip-flop circuit of the present invention.

The input combination when both S and R are high is never applied and has unpredictable results. Referring to FIG. 2, a positive edge-triggered S-R flip-flop circuit is indicated generally at 29. N-type FETs 23 and 24 receive controlling signal inputs S 21 and R 22 at their respective gate terminals. The common terminal 25 of the FETs 23 and 24 is connected to a circuit 28 identical to that of the D flip-flop indicated at 20. The other terminal of n-type FET 23 is connected to the power supply whereas the other terminal of n-type FET 24 is connected to the ground terminal. The operation of this circuit satisfies the logic of an S-R flip-flop and is explained as follow. When input S 21 is high and input R 22 is low, n-type transistor 23 is turned on while n-type transistor 24 is turned off. Thus, the voltage at node 25 can be considered logic high passed by conduction of transistor 23.

Now considering the operation of the positive edge-triggered D flip-flop that was explained in the previous paragraph, we can see that when the clock signal 26 goes from low to high, the circuit output 27 becomes high. When input S 21 is low and input R 22 is high, n-type transistor 23 is turned off while n-type transistor 24 is turned on. Thus, the voltage at node 25 can be considered logic low passed by conduction of transistor 24. Now considering the operation of the positive edge-triggered D flip-flop that was explained in the previous paragraph, we can see that when the clock signal 26 goes from low to high, the circuit output 27 becomes low. When both input S 21 and R 22 are low, both n-type transistors 23 and 24 are off and the value of node 25 is unchanged. Thus, on application of the positive going clock signal, the output 27 of the circuit 28 remains unchanged. Thus, the positive edge-triggered S-R flip-flop circuit behavior is satisfied.

Yet another common type of flip-flop circuit is a T flip-flop, also known as a toggle flip-flop. In general, the function of a T flip-flop can be explained as follows. When a controlling signal input, called T, is held low, then on the active edge of a clock input, the flip-flop circuit output retains its previous value. When the controlling signal input, T, is high, then on the active edge of the clock input, the flip-flop circuit output becomes the complement of its previous value, i.e. it toggles.

Figure 3:
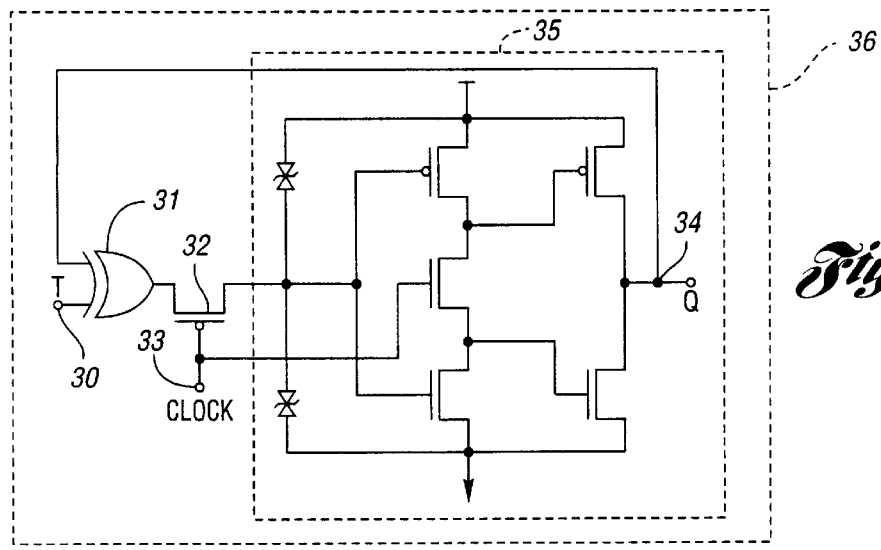
FIG. 3 is a schematic diagram of QMOS positive edge-triggered T flip-flop circuit of the present invention.

Referring to FIG. 3, a positive edge-triggered T flip-flop circuit is indicated generally at 36. The T input 30 forms the input of an XOR gate 31. The other input of the XOR gate comes from the output 34 of the T flip-flop circuit 36. The output 32 of the XOR gate 31 forms the input to a circuit 36 that is identical to the D flip-flop circuit indicated at 20. The operation of this circuit satisfies the logic of a T flip-flop and is explained as follows. When input T 30 is held low, the output 32 of the XOR gate 31 is the same as its other input, namely output 34 of the T flip-flop. Pursuant to the behavior of the D flip-flop explained earlier, on the arrival of the positive going transition on the clock input 33, the output 34 will remain at its previous value. When input T 30 is kept high, the output 32 of the XOR gate 30 is the complement of its other input, namely output 34 of the T flip-flop. Thus, according to the behavior of the D flip-flop explained earlier, on the arrival of the positive going transition on the clock input 33, the output 34 will become the complement of its previous value. Thus, the positive edge-triggered T flip-flop circuit behavior is satisfied.

Figure 4:
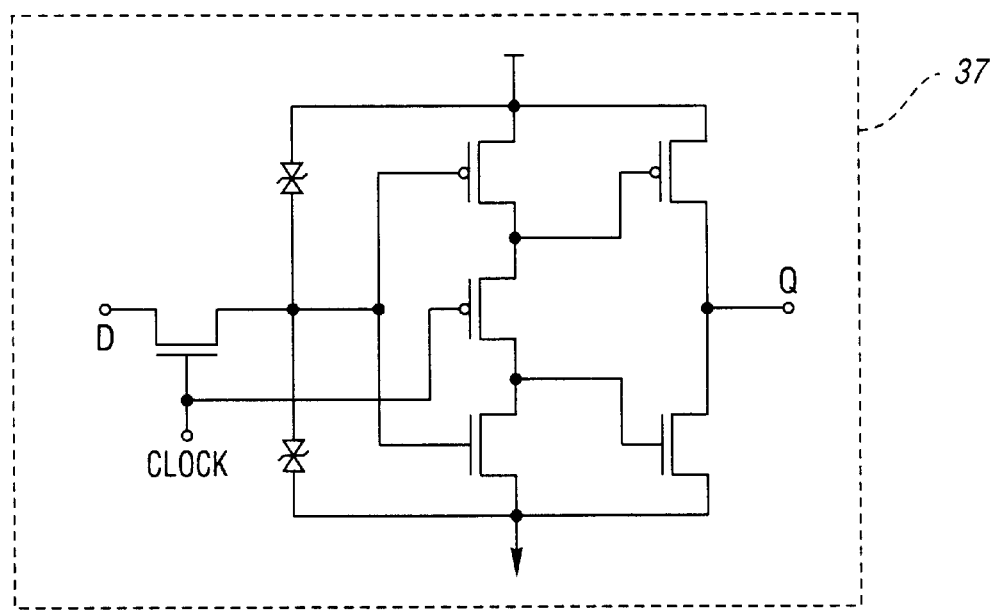
FIG. 4 is a schematic diagram of QMOS negative edge-triggered D flip-flop circuit of the present invention.
Figure 5:
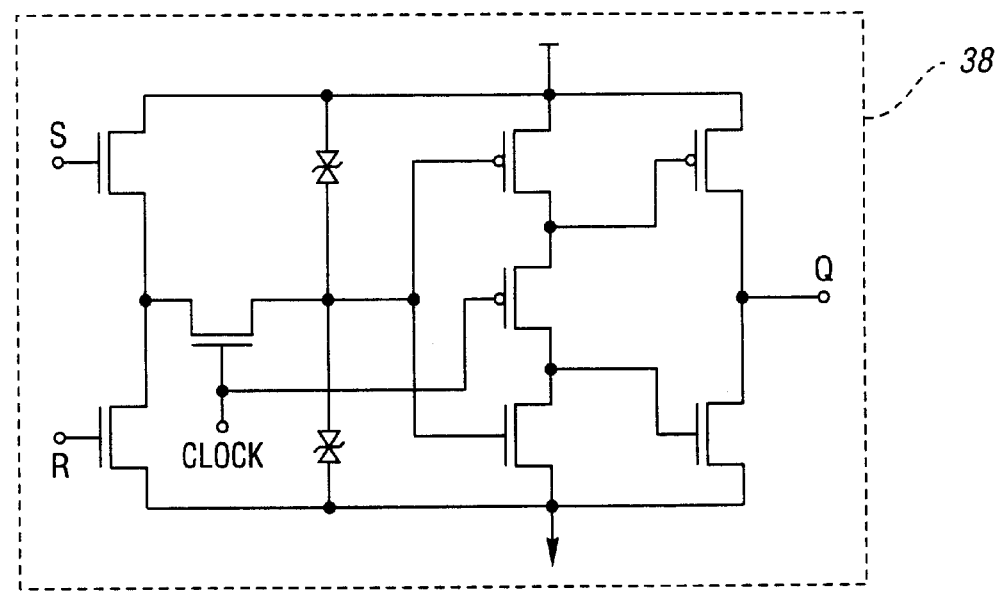
FIG. 5 is a schematic diagram of QMOS negative edge-triggered S-R flip-flop circuit of the present invention.
Figure 6:
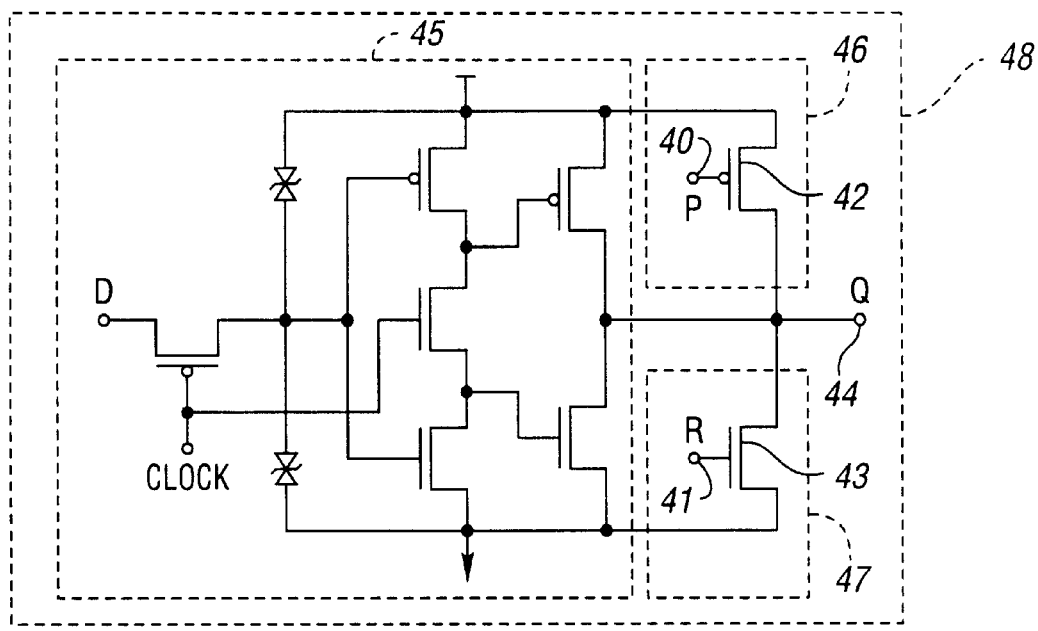
FIG. 6 is a schematic diagram of QMOS negative edge-triggered T flip-flop circuit of the present invention.

Now besides positive edge-triggered flip-flop circuits, an analogous class of flip-flop circuits are negative edge-triggered flip-flop circuits. In these circuits, the output of the flip-flop circuit responds to the data or controlling inputs on a high-to-low, or negative transition on the clock input. FIG. 4 shows a negative edge-triggered D flip-flop. FIG. 5 shows a negative edge-triggered S-R flip-flop. FIG. 6 shows a negative edge-triggered T flip-flop. Each of these negative edge-triggered flip-flops can be derived from their positive edge-triggered version described above by the following modification. In each positive edge-triggered flip-flop implementation of the present invention, there exists one p-type FET and one n-type FET whose gate terminals are connected to the clock signal input. In order to implement a negative edge-triggered version of the aforementioned positive edge-triggered flip-flops, we simply interchange the p-type FET and n-type FET whose gate terminals are connected to the clock input. For example, to convert the positive edge-triggered D flip-flop indicated at 20 to a negative edge-triggered D flip-flop, we would interchange transistors 3 and 8. This yields the negative edge-triggered D flip-flop depicted at 37. The negative edge-triggered S-R flip-flop indicated at 38 and the negative edge-triggered T flip-flop indicated at 39 can be similarly obtained from their positive edge-triggered versions depicted at 29 and 36, respectively.

While the D flip-flop operation as described herein is the most basic form of flip-flop circuit operation, some flip-flop circuits also provide means for setting the flip-flop circuit output node to a logic high or a logic low without necessity of a transition on the clock input of the flip-flop circuit, i.e. asynchronously. These operations are normally required to initialize the flip-flop circuit to a known value when power is applied to an integrated circuit. The operation of asynchronously setting a flip-flop circuit output to a logic low is called the reset operation whereas the operation of asynchronously setting a flip-flop output to a logic high is called the preset operation.

Figure 7:
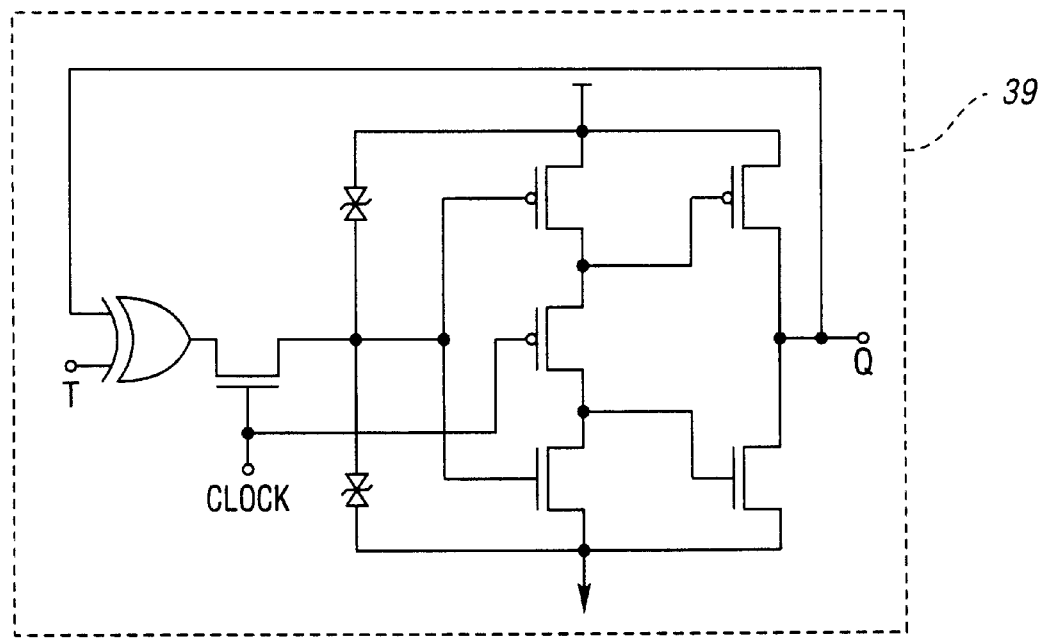
FIG. 7 is a schematic diagram of QMOS positive edge-triggered D flip-flop circuit of the present invention with means for asynchronous reset and preset operations.

A means of achieving asynchronous reset and preset operations in the flip-flops of the present invention is now presented. We shall choose the positive edge-triggered D flip-flop circuit to illustrate these means, although they are similarly applicable to all the flip-flop circuit topologies that are part of the present invention. A positive edge-triggered flip-flop circuit with asynchronous reset and preset means is generally indicated at 48 in FIG. 7. It consists of a positive edge-triggered D flip-flop of the present invention 45, to which a preset logic block 46 and a reset logic block 47 are added. The preset logic block 46 consists of a p-type FET 42 whose gate terminal receives the asynchronous preset signal P 40. The source terminal of the p-type FET 42 is connected to the power supply terminal and its drain terminal is connected to the flip-flop circuit output Q 44.

The reset logic block 47 consists of an n-type FET 43 whose gate terminal receives the asynchronous reset signal R 41. The source terminal of the n-type FET 43 is connected to the ground terminal and its drain terminal is connected to the flip-flop circuit output Q 44. When signal P 40 and signal R 41 are both set to logic low, p-type transistor 42 is turned on while n-type transistor 43 is turned off. This results in output Q 44 turning to logic high via conduction from the power supply through p-type FET 42. Thus, the asynchronous preset operation is achieved.

On completion of the preset operation, the input P 40 is set to logic high. When signal P 40 and signal R 41 are both set to logic high, p-type transistor 42 is turned off while n-type transistor 43 is turned on. This results in output Q 44 turning to logic low via discharge to the ground terminal through n-type FET 43. Thus, the asynchronous reset operation is achieved. On completion of the asynchronous reset operation, input R 41 is set to logic low. The preset block 46 and the reset block 47 may be added to all discussed flip-flop circuit topologies 20, 29, 36, 37, 38 and 39 of the present invention to achieve asynchronous preset and reset operations.

The flip-flops of the present invention may also be designed with only preset or only reset options. If only preset is required, a designer need only add the preset block 46 to the basic edge-triggered flip-flop circuits indicated at 20, 29, 36, 37, 38 and 39. For asynchronous preset to occur, we now only need to set P 40 to logic low, and set it back to logic high on completion of the preset operation. Similarly, if only reset is required, a designer need only add the reset block 47 to the basic edge-triggered flip-flop circuits indicated at 20, 29, 36, 37, 38 and 39. To asynchronously reset the flip-flop circuits, we only now need to set R 41 to logic high, and set it to logic low on completion of the reset operation.

It should be evident by now that the flip-flop circuits of the present invention have reduced setup and hold time periods due to the reduction in number of transistors in the input block prior to the latch circuit. It should also be evident that the latch circuit comprised of NDR diodes actively maintains a driven value to the input node of the output block. This is unlike dynamic flip-flops of the prior art that utilize dynamic charge storage which is susceptible to corruption via noise signals at the storage node. Also, clearly the flip-flops presented are edge-triggered in nature, being either positive edge-triggered or negative edge-triggered. The flip-flops of the present invention utilize fewest number of transistors of any known edge-triggered flip-flop circuit. Thus, the present invention demonstrates means to designing the first known edge-triggered flip-flop circuits using NDR diodes. Additionally, these circuits have the advantage of being compact and fast, previously mentioned as prime criteria for flip-flop circuit design.

Figure 8:
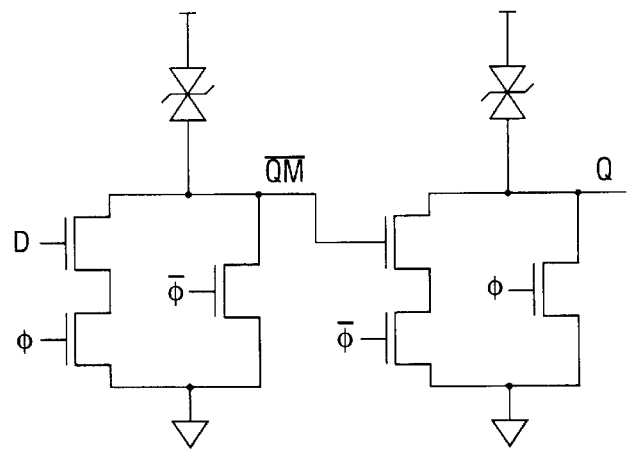
FIG. 8 is a schematic diagram of a D flip-flop circuit of the present invention utilizing bistable NDR logic.

Referring now to FIG. 8, a schematic of a bistable D flip-flop circuit using NDR diodes and FETs is shown. The flip-flop includes two cascaded bistable NDR inverters operating on opposite phases, φ and φ̄, of a clock signal. This circuit implements a master-slave flip-flop topology. The master bistable inverter is activated when the clock goes high. If the D input of the flip-flop is high, the current through the pull-down network of the master latch exceeds the peak current of the RTD, causing a switch to PDR2 that results in the master output, QM, going low. If the D input of the flip-flop is low, on arrival of the clock pulse, the pull-down network of the master latch is cutoff resulting in RTD operation in PDR1 and the master output going high.

When the clock signal goes low, the quiescent current flowing through the master latch maintains the evaluated output irrespective of changes in the input. At the same time, when the clock is low, the slave latch is activated. If QM is high, the current through the pull-down network of the slave latch exceeds the peak current of the RTD, causing a switch to PDR2 of the slave latch RTD that results in the slave output, Q, going low. If QM is low, the pull-down network of the slave latch is cutoff resulting in RTD operation in PDR1 and Q going high. When the clock goes back high, Q remains unchanged irrespective of changes in QM.

Thus, the state of this bistable QMOS master-slave flip-flop changes on the negative edge of the clock pulse. The flip-flop can be made to evaluate on the positive edge of the clock by reversing the phases of the clock signals applied to the master and slave latches.

Figure 9:
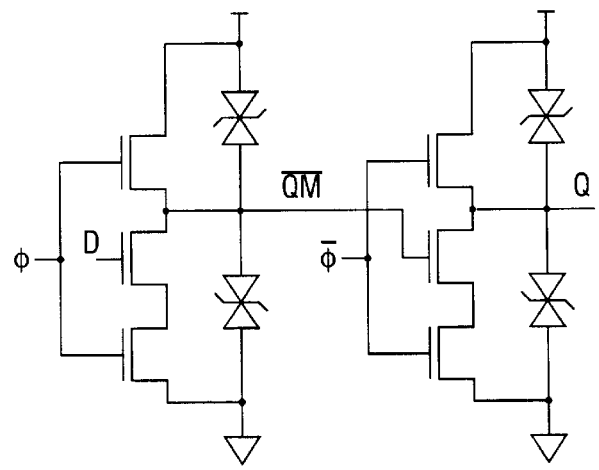
FIG. 9 is a schematic diagram of a D flip-flop circuit utilizing cascaded NDR latches.

Referring now to FIG. 9, a latched NDR logic circuit including cascaded NDR latches can also be used to implement a flip-flop circuit of the present invention.

Figure 10:
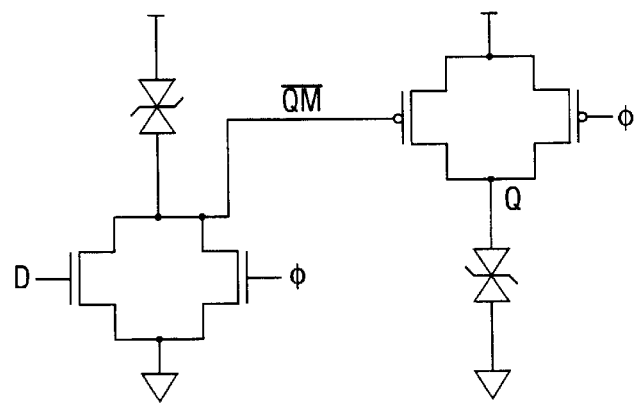
FIG. 10 is a schematic diagram of a pseudo-bistable, true single phase clock NDR D flip-flop circuit.

Pseudo-bistable logic offers a very compact implementation of a flip-flop circuit using only 2 RTDs and 4 MOS transistors. A schematic diagram of a pseudo-bistable master-slave QMOS D flip-flop is illustrated in FIG. 10. The master latch uses NMOS transistors while the slave latch uses PMOS transistors.

Unlike the bistable and latched NDR flip-flop implementations of FIGS. 8 and 9, neither the master latch nor the slave latch of FIG. 10 is truly bistable. However, when the two pseudo-bistable latches are cascaded, due to the requirement of a consensus between the latch input and clock for the latch output to change, it is possible to eliminate races in the circuit without necessity for true bistable operation of the latches. This makes the flip-flop implementation possible. It is useful to consider all possible input combinations to understand the operation of the pseudo-bistable QMOS flip-flop.

Assume that D is low as is the clock at the start of operation. This implies that QM is high and Q is latched at its current value. Now if D goes high, there is no change in QM since a clock pulse is required to push the RTD of the master latch over its peak. This also means that Q retains its low value. When the clock goes high, the master latch is evaluated, causing QM to go low. When QM goes low, the slave latch output Q goes high since its input PMOS transistor is sized to switch the RTD to PDR2 independent of the clock signal. When the clock signal goes low, the QM output remains low until D goes low. This keeps the Q output high since the slave latch output is maintained at its quiescent pont. When both D and clock are low, QM goes high but the slave latch output Q remains high due to the difference between its input and clock values. Only when the clock signal goes high does the slave latch output Q go low because of the consensus between its input and clock signals.

Due to elimination of two clock transistors, the pseudo-bistable flip-flop is more compact than the bistable and latched QMOS flip-flops. Also, in the pseudo-bistable flip-flop, the critical path in the slave pull-up network consists of two parallel PMOS transistors that can be designed to have similar performance as the two series NMOS transistors in the bistable and latched QMOS flip-flops. In the bistable and latched QMOS flip-flops, the clock signal and its complement drives the gates of four NMOS transistors, whereas in the pseudo-bistable QMOS flip-flop the clock signal drives the gates of one NMOS and one PMOS transistor. This represents a significant reduction in the load on the clock lines, resulting in reduced clock skew and better performance.

While the best mode for carrying out the invention has been described in detail, those familiar with the art to which this invention relates will recognize various alternative designs and embodiments for practicing the invention as defined by the following claims.

What is claimed is:

1. A high-speed, compact, edge-triggered, flip-flop circuit comprising:

an input circuit section having at least one input for receiving at least one input signal, a clock input for receiving a clock signal having two states and a data output;

a latch circuit section having at least one semiconductor device, the at least one semiconductor device having negative differential resistance characteristics and being connected to the data output of the input circuit section; and an output circuit section having a data input connected to the at least one semiconductor device, a clock input for receiving the clock signal and a data output wherein a value is stored at the data output of the output circuit section in response to the at least one input signal when the clock signal makes a transition from one of its states to the other one of its states.

2. The circuit as claimed in claim 1 wherein the circuit is a D flip-flop circuit and wherein the at least one input signal is a data input signal having a value and wherein the value stored at the data output of the output circuit section has the value of the data input signal after the clock signal makes the transition.

3. The circuit as claimed in claim 1 wherein the circuit is a T flip-flop circuit and wherein the at least one input signal is a toggle input signal to toggle the circuit when the clock signal make the transition.

4. The circuit as claimed in claim 1 wherein the circuit is an S-R flip-flop circuit and wherein the input circuit section has first and second inputs for receiving set or reset input signals, respectively, to set or reset the circuit when the clock signal makes the transition.

5. The circuit as claimed in claim 1 further comprising:

an asynchronous preset circuit section for setting the data output of the output circuit section to a stable state without the necessity of receiving the clock signal.

6. The circuit as claimed in claim 1 further comprising an asynchronous reset circuit section for setting the data output of the output circuit section to a stable state without the necessity of receiving the clock signal.

7. The circuit as claimed in claim 1 wherein the latch circuit section includes a plurality of semiconductor devices, the devices having negative differential resistance characteristics and being connected to the data output of the input circuit section.

8. The circuit as claimed in claim 1 wherein the latch circuit section includes a plurality of semi-conductor devices, the plurality of semiconductor devices include a pair of negative differential resistance diodes.

9. The circuit as claimed in claim 7 wherein the diodes are series-connected resonant tunneling diodes.

10. The circuit as claimed in claim 7 wherein the plurality of semiconductor devices include a pair of negative differential resistance diodes having a folded-back, current-voltage characteristic.

11. The circuit as claimed in claim 1 wherein the output circuit section also has at least one semiconductor device having negative differential resistance characteristics and is connected to the data output of the output circuit section.

12. The circuit as claimed in claim 11 wherein the output circuit section includes a plurality of semiconductor devices having negative differential resistance characteristics and are connected to the data output of the output circuit section.

13. The circuit as claimed in claim 11 wherein the at least one semi-conductor device includes a pair of cascaded bistable NDR inverters which operate on opposite phases of the clock signal.

14. The circuit as claimed in claim 12 wherein the plurality of negative differential devices includes a pair of cascaded bistable NDR latches which operate on opposite phases of the clock signal.

15. The circuit as claimed in claim 11 wherein the at least one semi-conductor device includes a pair of cascaded pseudo-bistable latches which operate on the same phase of the clock signal.

16. The circuit as claimed in claim 3 wherein the input circuit section includes a feedback circuit section connected to the data output of the output circuit section and the at least one input of the input circuit section.

17. A flip-flop circuit including a clock input, data input, and a Q output comprising:
    an input block including a first input coupled to the data input, a second input coupled to the clock input, and an output, said input block for coupling said data input to the said output when the clock signal applied to the clock input is in a first phase;
    a latch circuit including a common terminal coupled to said output of said input block and also to a first input of an output block, said latch circuit for storing the value of the said output of the said input block; and
    said output block including a first input coupled to the said common terminal of the said latch circuit, a second input coupled to the clock input, and an output coupled to the Q output, said output block for receiving the data from the said latch circuit and storing it at the said Q output when the clock signal applied to the clock input transitions from a first phase to a second phase.

18. The circuit as claimed in claim 17 further including a power means and a ground means to receive power supply from an external means.

19. The circuit as claimed in claim 18 wherein the said latch circuit comprises:
    two series-connected NDR diodes with their common terminal coupled to said output of said input block and also to said first input of said output block for latching the signal at the said common terminal;
    a coupling to said power means from a terminal of a first NDR diode other than the said common terminal; and
    a coupling to said ground means from a terminal of a second NDR diode other than the said common terminal.

20. The circuit as claimed in claim 17 wherein said input block comprises a transistor of a first conductivity type having a first electrode coupled to the said first input which is coupled to the said data input, a control electrode coupled to the said second input which is coupled to the clock input, and a second electrode coupled to said output of the input block.

21. The circuit as claimed in claim 18 wherein the said output block comprises:
    a first transistor of a first conductivity type having a first electrode coupled to said power means, a control electrode coupled to said common terminal of the said latch circuit, and a second electrode;
    a second transistor of a second conductivity type having a first electrode, a control electrode coupled to the second input of the output block which is coupled to the said clock input, and a second electrode which is coupled to the second electrode of the said first transistor;
    a third transistor of a second conductivity type having a first electrode coupled to the said ground means, a control electrode coupled to said common terminal of the said latch circuit, and a second electrode coupled to the first electrode of the said second transistor;
    a fourth transistor of a first conductivity type having a first electrode coupled to said power means, a control electrode coupled to the second electrode of the said first transistor, and a second electrode coupled to the said output of the output block which is coupled to the said Q output; and
    a fifth transistor of a second conductivity type having a first electrode coupled to the said ground means, a control electrode coupled to the first electrode of the said second transistor, and a second electrode coupled to the said output of the output block which is coupled to the said Q output.

22. The circuit as claimed in claim 18 further including a logic circuit comprising:
    a first transistor of a second conductivity type having a first electrode coupled to said power means, a control electrode coupled to an S input, and a second electrode coupled to the said data input; and
    a second transistor of a second conductivity type having a first electrode coupled to said ground means, a control electrode coupled to an R input, and a second electrode coupled to the said data input.

23. The circuit as claimed in claim 18 further including a logic circuit comprising an XOR gate having a first input that is coupled to a T input, a second input that is coupled to the said Q output, and an output that is coupled to said data input.

24. The circuit as claimed in claim 21 further including:
    a preset logic block comprising a transistor of a first conductivity type having a first electrode coupled to said power means, a control electrode coupled to a P input, and a second electrode coupled to the said Q output; and
    a reset logic block comprising a transistor of a second conductivity type having a first electrode coupled to said ground means, a control electrode coupled to an R input, and a second electrode coupled to the said Q output.

25. The circuit as claimed in claim 22 further including:
    a preset logic block comprising a transistor of a first conductivity type having a first electrode coupled to said power means, a control electrode coupled to a P input, and a second electrode coupled to the said Q output; and a reset logic block comprising a transistor of a second conductivity type having a first electrode coupled to said ground means, a control electrode coupled to an R input, and a second electrode coupled to the said Q output.

26. The circuit as claimed in claim 23 further including:

a preset logic block comprising a transistor of a first conductivity type having a first electrode coupled to said power means, a control electrode coupled to a P input, and a second electrode coupled to the said Q output; and a reset logic block comprising a transistor of a second conductivity type having a first electrode coupled to said ground means, a control electrode coupled to an R input, and a second electrode coupled to the said Q output.

27. The circuit as claimed in claim 17 wherein said input block comprises a transistor of a second conductivity type having a first electrode coupled to the said first input which is coupled to the said data input, a control electrode coupled to the said second input which is coupled to the clock input, and a second electrode coupled to said output of the input block.

28. The circuit as claimed in claim 18 wherein the said output block comprises:

a first transistor of a first conductivity type having a first electrode coupled to said power means, a control electrode coupled to said common terminal of the said latch circuit, and a second electrode;

a second transistor of a first conductivity type having a first electrode, a control electrode coupled to the second input of the output block which is coupled to the said clock input, and a second electrode which is coupled to the second electrode of the said first transistor;

a third transistor of a second conductivity type having a first electrode coupled to the said ground means, a control electrode coupled to said common terminal of the said latch circuit, and a second electrode coupled to the first electrode of the said second transistor;

a fourth transistor of a first conductivity type having a first electrode coupled to said power means, a control electrode coupled to the second electrode of the said first transistor, and a second electrode coupled to the said output of the output block which is coupled to the said Q output; and a fifth transistor of a second conductivity type having a first electrode coupled to the said ground means, a control electrode coupled to the first electrode of the said second transistor, and a second electrode coupled to the said output of the output block which is coupled to the said Q output.

29. The circuit as claimed in claim 28 further including a logic circuit comprising:

a first transistor of a second conductivity type having a first electrode coupled to said power means, a control electrode coupled to an S input, and a second electrode coupled to the said data input; and a second transistor of a second conductivity type having a first electrode coupled to said ground means, a control electrode coupled to an R input, and a second electrode coupled to the said data input.

30. The circuit as claimed in claim 28 further including a logic circuit comprising an XOR gate having a first input that is coupled to a T input, a second input that is coupled to the said Q output, and an output that is coupled to said data input.

31. The circuit as claimed in claim 28 further including:

a preset logic block comprising a transistor of a first conductivity type having a first electrode coupled to said power means, a control electrode coupled to a P input, an a second electrode coupled to the said Q output; and a reset logic block comprising a transistor of a second conductivity type having a first electrode coupled to said ground means, a control electrode coupled to an R input, and a second electrode coupled to the said Q output.

32. The circuit as claimed in claim 18 further including:

a preset logic block comprising a transistor of a first conductivity type having a first electrode coupled to said power means, a control electrode coupled to a P input, and a second electrode coupled to the said Q output; and a rest logic block comprising a transistor of a second conductivity type having a first electrode coupled to said ground means, a control electrode coupled to an R input, and a second electrode coupled to the said Q output.

33. The circuit as claimed in claim 28 further including:

a preset logic block comprising a transistor of a first conductivity type having a first electrode coupled to said power means, a control electrode coupled to a P input, and a second electrode coupled tot he said Q output; and a reset logic block comprising a transistor of a second conductivity type having a first electrode coupled to said ground means, a control electrode coupled to an R input, and a second electrode coupled to the said Q output.

* * * * *